(12) United States Patent
Kim

(10) Patent No.: US 7,504,308 B2
(45) Date of Patent: Mar. 17, 2009

(54) METHOD OF DUAL BIRD'S BEAK LOCOS ISOLATION

(75) Inventor: Chang Nam Kim, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 471 days.

(21) Appl. No.: 11/319,588

(22) Filed: Dec. 29, 2005

(65) Prior Publication Data

US 2006/0148207 A1    Jul. 6, 2006

(30) Foreign Application Priority Data

Dec. 30, 2004   (KR) .................... 10-2004-0117430

(51) Int. Cl.
*H01L 21/8234*   (2006.01)
(52) U.S. Cl. .................. 438/275; 438/445; 438/981; 257/E21.552
(58) Field of Classification Search .......... 438/225, 438/275, 445, 981; 257/E21.552
See application file for complete search history.

(56) References Cited

U.S. PATENT DOCUMENTS 5,455,438 A * 10/1995 Hashimoto et al. .......... 257/391
5,786,264 A *  7/1998 Hwang ....................... 438/443

* cited by examiner

*Primary Examiner*—Chandra Chaudhari
(74) *Attorney, Agent, or Firm*—McKenna Long & Aldridge LLP

(57) ABSTRACT

A method of dual bird's beak LOCOS may reduce a design rule for a more cost-effective logic device formation. The method may also form a LOCOS layer having a smooth bird's beak to fabricate a stable high-voltage device. The method includes steps of defining a low-voltage device area for a logic device and a high-voltage device area for a high-voltage device, forming a first pad layer in the low-voltage device area and a second pad layer in the high-voltage device area, the first pad layer being thinner than the second pad layer, and forming LOCOS type device isolation layers having bird's beaks differing in size in each of the low-voltage device area and the high-voltage device area, by oxidizing a portion of the semiconductor substrate exposed by a hard mask.

10 Claims, 6 Drawing Sheets

METHOD OF DUAL BIRD'S BEAK LOCOS ISOLATION

This application claims the benefit of Korean Patent Application No. 10-2004-0117430, filed on Dec. 30, 2004, which is hereby incorporated by reference for all purposes as if fully set forth herein.

BACKGROUND OF THE INVENTION

1. Field of the Invention

The present invention relates to a semiconductor device isolation, and more particularly, to a method of dual bird's beak local-oxidation-of-silicon (LOCOS) isolation.

2. Discussion of the Related Art

In implementing a semiconductor device on a semiconductor substrate such as a silicon substrate, device isolation is preferentially performed. A LOCOS of thermal oxidation is an example of semiconductor device isolation. A LOCOS device isolation layer includes "bird's beaks" at both ends of the device isolation layer. The size of the bird's beak affects the operation of a device.

High-voltage or high-power devices are substantially less affected by a size of the bird's beak. Yet, such devices include logic components operating at a relatively low voltage. For the low-voltage logic components, LOCOS having a small bird's beak is preferred. Instead of LOCOS, shallow-trench isolation is substantially used for reducing a design rule having a size of 0.25 µm or below.

However, high-voltage or high-power devices prefer LOCOS that provides a device isolation layer having a smoother end to mitigate an electric field applied to a junction. By reducing the electric field effect applied to an edge of the LOCOS layer, a device becomes more stable in terms of reliability and its safe-operating-area characteristics and exhibits a lower leakage current.

In high-voltage or high-power process technology, a logic component is basically isolated by LOCOS. The high-voltage or high-power process technology plays a role in protecting the logic component if a great electric field is applied to a drain extended region of a high-voltage device, e.g., DMOS or LDMOS.

For instance, the LOCOS device isolation process includes steps of forming a pad oxide layer for device isolation, depositing a pad nitride layer or a layer for a hard mask for device isolation, forming a hard mask for device isolation by patterning, and removing the nitride pad layer used as the hard mask by wet etching. After completion of the LOCOS device isolation process, a transistor is fabricated.

Hence, the LOCOS process provides the same-sized bird's beak regardless of a high-voltage device or a low-voltage device. Since the device isolation is performed mainly for the high-voltage device, the bird's beak on the edge of the LOCOS layer is formed to be smooth and large. Hence, a design rule for a low-voltage logic circuit is considerably raised.

However, since the logic devices as the logic components are formed together with the high-voltage or high-power device, when integrating the high-voltage and logic devices together, a fabricating process meeting the two requirements is needed. The design rule needs to be reduced for cost-effective logic devices. For high-voltage devices, the LOCOS layer having a smooth bird's beak is formed to fabricate a stable high-voltage device.

SUMMARY OF THE INVENTION

Accordingly, the present invention is directed to a method of dual bird's beak LOCOS isolation that substantially obviates one or more problems due to limitations and disadvantages of the related art.

An advantage of the present invention is to provide a method of dual bird's beak LOCOS isolation, by which a design rule is reduced for a more cost-effective logic device formation and by which a LOCOS layer having a smooth bird's beak is formed to fabricate a stable high-voltage device.

Another advantage of the present invention is to provide a dual bird's beak LOCOS isolation method that lowers costs by reducing the design rule for a logic device and fabricates a stable high-voltage with a smooth LOCOS bird's beak for a high-voltage device.

Additional features and advantages of the invention will be set forth in the description which follows, and will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a method of dual bird's beak LOCOS isolation includes defining in a semiconductor substrate a low-voltage device area for a logic device and a high-voltage device area for a high-voltage device, forming a first pad layer in the low-voltage device area and a second pad layer in the high-voltage device area, the first pad layer being thinner than the second pad layer, forming a hard mask on the first pad layer and the second pad layer, and forming at least one LOCOS type device isolation layer having bird's beaks differing in size in each of the low-voltage device area and the high-voltage device area, by oxidizing a portion of the semiconductor substrate exposed by the hard mask.

According to another aspect of the present invention, a method of dual bird's beak LOCOS isolation includes defining in a semiconductor substrate a low-voltage device area for a logic device and a high-voltage device area for a high-voltage device, forming a pad layer on the semiconductor substrate, forming, on the pad layer, a first hard mask layer in the low-voltage device area and a second hard mask layer in the high-voltage device area, the first hard mask layer being thicker than the second hard mask layer, patterning the first hard mask layer and the second hard mask layer to form a first hard mask and a second hard mask, respectively, and forming at least one LOCOS type device isolation layer having bird's beaks differing in size in each of the low-voltage device area and the high-voltage device area, by respectively oxidizing portions of the semiconductor substrate exposed by the first hard mask and the second hard mask.

According to another aspect of the present invention, a method of dual bird's beak LOCOS isolation includes defining in a semiconductor substrate a low-voltage device area for a logic device and a high-voltage device area for a high-voltage device, forming a first pad layer in the low-voltage device area and a second pad layer in the high-voltage device area, the first pad layer being thinner than the second pad layer, forming a first hard mask layer on the first pad layer and a second hard mask layer on the second pad layer, the first hard mask layer being thicker than second hard mask layer, patterning the first hard mask layer and the second hard mask layer to form a first hard mask and a second hard mask, respectively, and forming at least one LOCOS type device isolation layer having bird's beaks differing in size in each of the low-voltage device area and the high-voltage device area, by respectively oxidizing portions of the semiconductor substrate exposed by the first hard mask and the second hard mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

A device isolation process that may provide two different LOCOS edge characteristics is disclosed. For instance, a LOCOS process may provide a device having two kinds of bird's beaks differing from each other in length. High-voltage or high-power process technology basically isolates a logic device by LOCOS and protects the device from a large electric field of a drain extended region of a high-voltage device such as DEMOS and LDMOS.

In the LOCOS device isolation, a pad layer, which may be made of silicon oxide, is used for a device isolation process that forms differing thicknesses. Namely, a pad layer in a big bird's beak side is formed relatively thick, whereas a pad layer in a small bird's beak side is formed relatively thin. Alternatively, LOCOS is performed using a hard mask, which may be made of a silicon nitride layer having different thicknesses. A hard mask in a big bird's beak side is formed relatively thin, whereas a hard mask in a small bird's beak side is formed relatively thick. In each of the above-explained two cases, two oxide or two nitride layers differing in thickness can be implemented by patterning and etching performed on an area of mask layer to be thinned.

FIGS. 1-5 are schematic cross-sectional diagrams of a device fabricated using a dual bird's beak LOCOS device isolation method according to an exemplary embodiment of the present invention.

Figure 1:
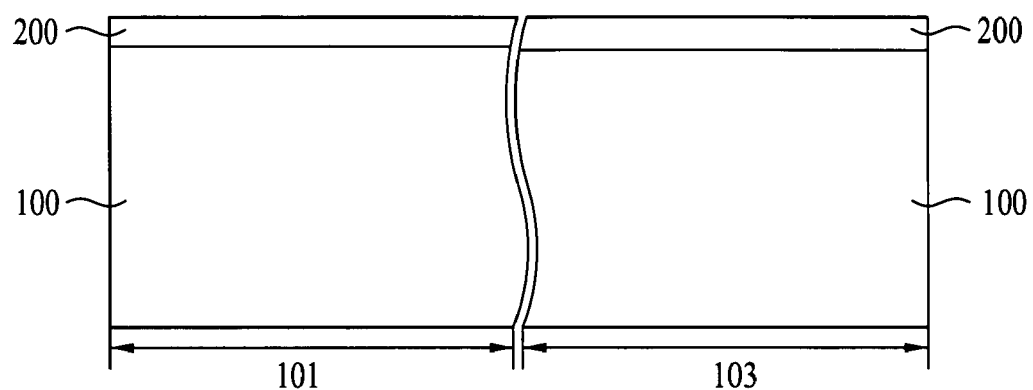
FIGS. 1-5 are schematic cross-sectional diagrams of a device fabricated by using a dual bird's beak LOCOS device isolation method according to an exemplary embodiment of the present invention.

Referring to FIG. 1, a pad layer 200 for device isolation is formed on a semiconductor substrate 100. The pad layer 200 may include a silicon oxide layer if the semiconductor substrate 100 is a silicon substrate. The semiconductor substrate 100 can be divided into a low-voltage device area 101 for a low-voltage device such as a logic device to be formed thereon and a high-voltage device area 103 for a high-voltage or high-power device to be formed thereon.

Figure 2:
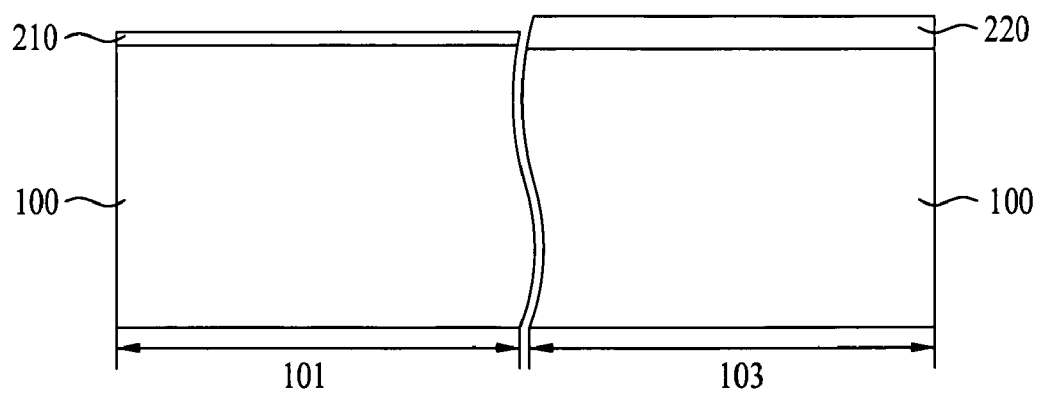

Referring to FIG. 2, the pad layer 200 is selectively etched by photolithography to form a relatively thin first pad layer 210 on the low-voltage device area 101 and a relatively thick second pad layer 220 on the high-voltage device area 103. After a photoresist pattern (not shown) selectively exposing the low-voltage device area 101 has been formed, an exposed portion of the pad layer 200 is selectively etched using the photoresist pattern as an etch mask to reduce its thickness. Hence, the second pad layer 220 substantially maintains its initial thickness of the pad layer 200.

Figure 3:
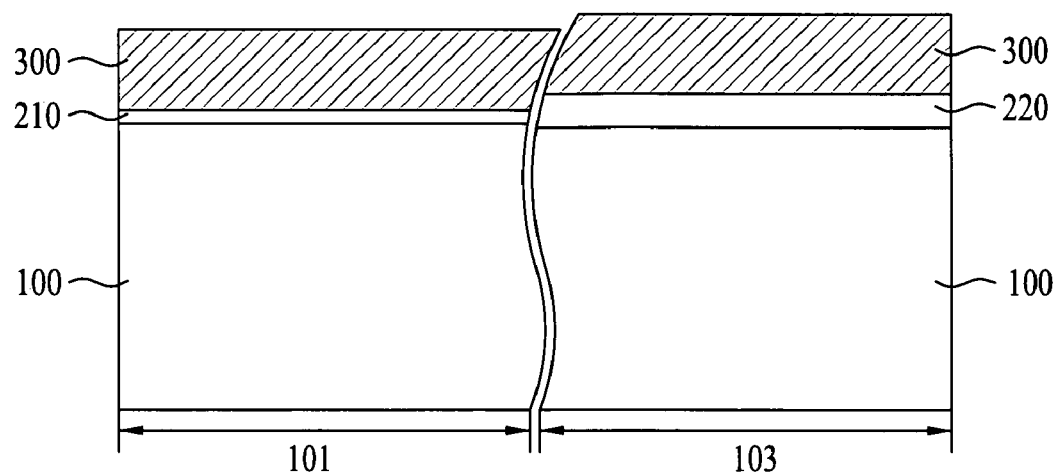

Referring to FIG. 3, an insulating layer such as silicon nitride for a hard mask is deposited on the first and second pad layers 210 and 220. A hard mask layer 300 can be called a pad nitride layer.

Figure 4:
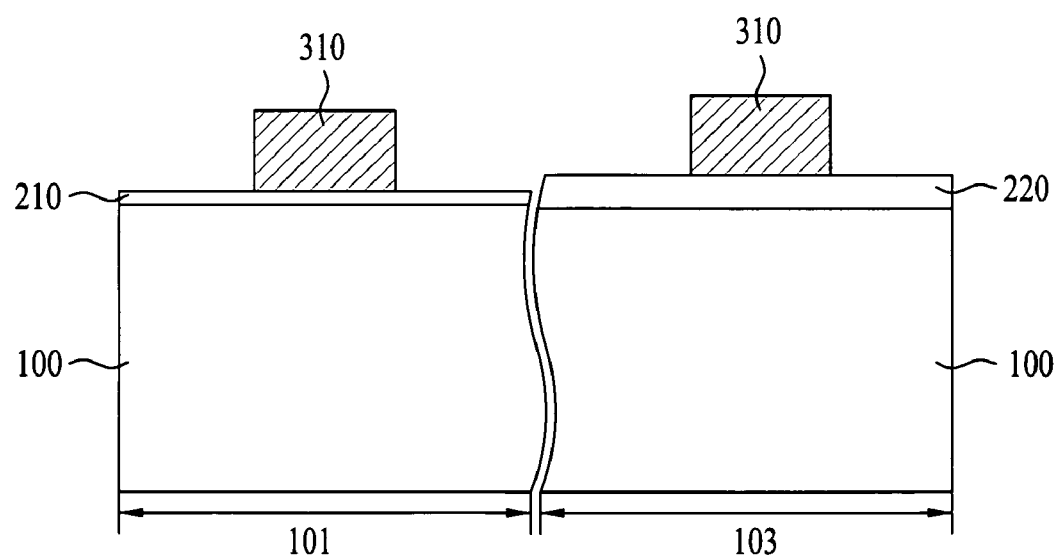

Referring to FIG. 4, the hard mask layer 300 is patterned to form a hard mask 310 by which an active area to have a transistor device formed thereon is covered and by which a field area for device isolation is exposed.

Figure 5:
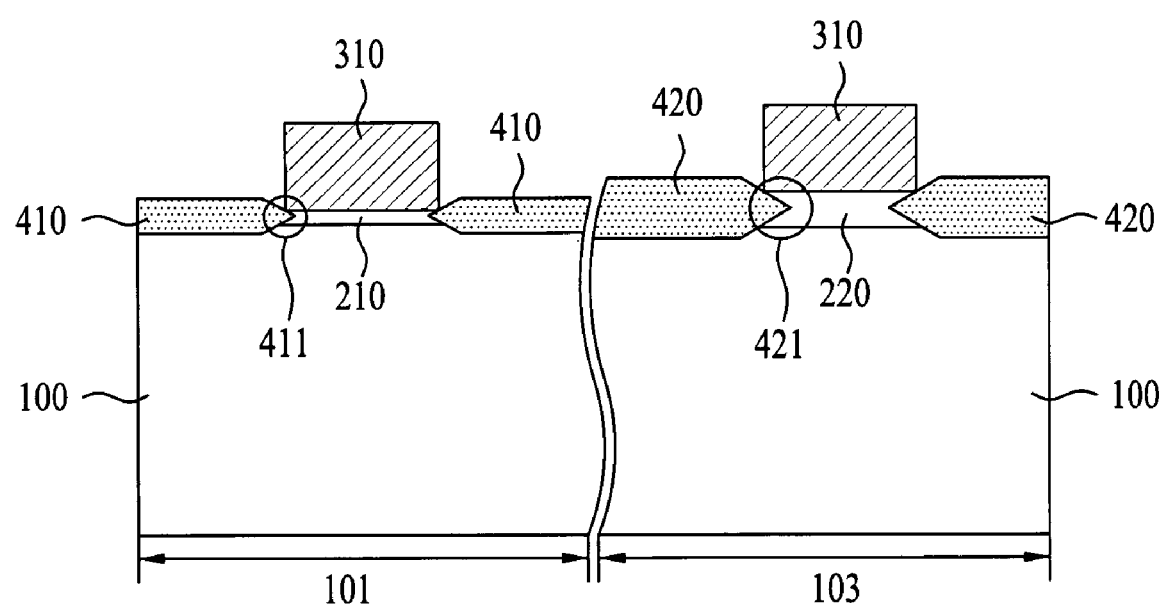

Referring to FIG. 5, field oxidation is performed to form device isolation layers 410 and 420 on a surface of the semiconductor substrate 100 exposed by the hard mask 310. The field oxidation may include thermal oxidation. The device isolation layers 410 and 420 are formed as LOCOS device isolation layers, respectively. Since the first and second pad layers 210 and 220 formed in the low-voltage device area and the high-voltage device area 101 and 103 have different thicknesses, respectively, the first device isolation layer 410 formed in the low-voltage device area 101 has a first bird's beak 411 smaller than a second bird's beak 421 of the second device isolation layer 420 formed in the high-voltage device area 103.

Fabrication costs can be lowered by reducing the design rule for a logic device. A stable high-voltage device can be fabricated by forming a smooth bird's beak LOCOS layer for the high-voltage device. Thus, the dual bird's beak LOCOS device isolation according to the present invention can be achieved.

FIGS. 6-9 are schematic cross-sectional diagrams of a device fabricated using a dual bird's beak LOCOS device isolation method according to another exemplary embodiment of the present invention.

Figure 6:
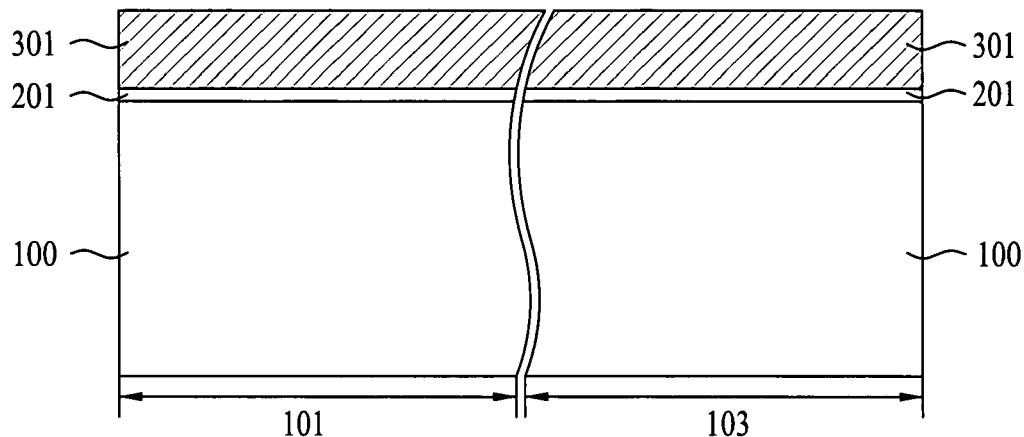
FIGS. 6-9 are schematic cross-sectional diagrams of a device fabricated by using a dual bird's beak LOCOS device isolation method according to another exemplary embodiment of the present invention.

Referring to FIG. 6, a pad layer 201 for device isolation is formed on a semiconductor substrate 100. The pad layer 201 can include a silicon oxide layer if the semiconductor substrate 100 is a silicon substrate. The semiconductor substrate 100 can be divided into a low-voltage device area 101 for a low-voltage device such as a logic device to be formed thereon and a high-voltage device area 103 for a high-voltage or high-power device to be formed thereon. The pad layer 201 can be formed thinner than the pad layer 200 of FIGS. 1-5.

An insulating layer such as silicon nitride for a hard mask is deposited on the pad layer 201. A hard mask layer 301 can be called a pad nitride layer.

Figure 7:
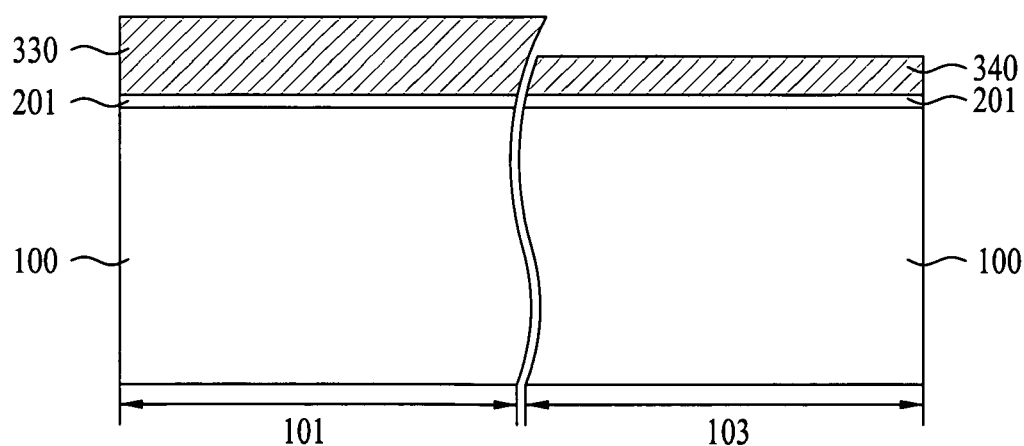

Referring to FIG. 7, the hard mask layer 301 is selectively etched by photolithography to form a relatively thick first hard mask layer 330 on the low-voltage device area 101 and a relatively thin second hard mask layer 340 on the high-voltage device area 103. For example, after a photoresist pattern (not shown) selectively exposing the high-voltage device area 103 has been formed, an exposed portion of the hard mask layer 301 is selectively etched using the photoresist pattern as an etch mask to reduce its thickness. Hence, the first hard mask layer 311 substantially maintains its initial thickness of the hard mask layer 301.

Figure 8:
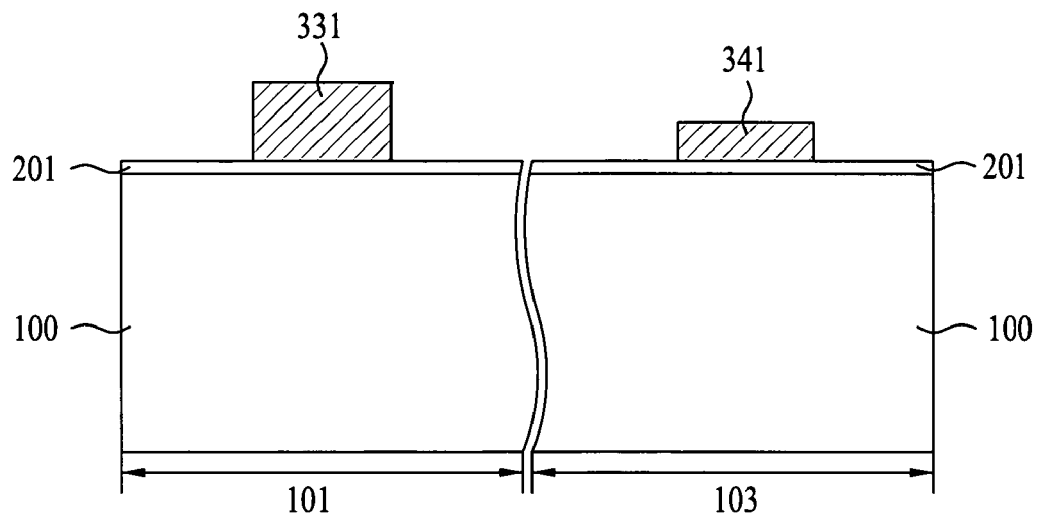

Referring to FIG. 8, the first hard mask layer and the second hard mask layer 330 and 340 are patterned to form a first hard mask and a second hard mask 331 and 341 by which active areas having transistor devices formed thereon are covered and by which field areas for device isolation are exposed, respectively.

Figure 9:
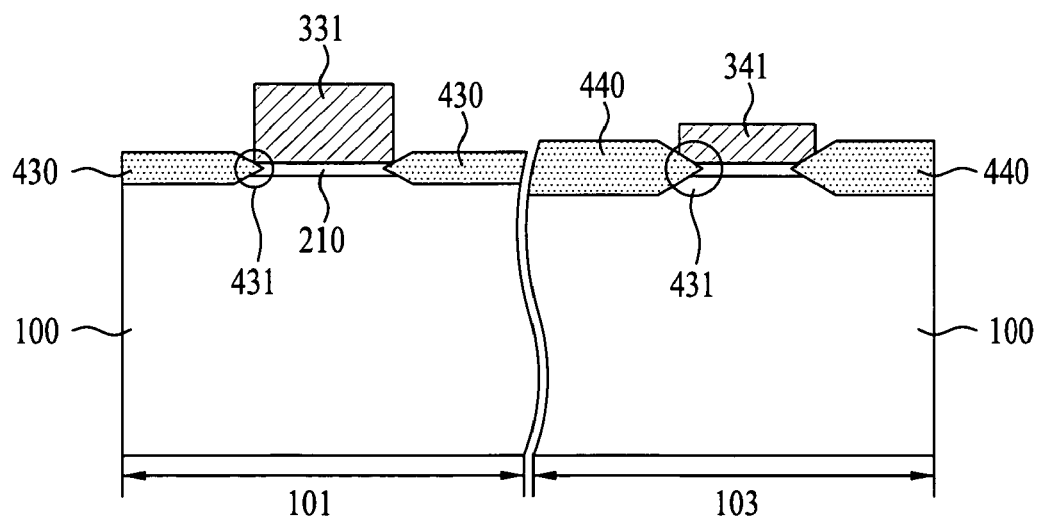

Referring to FIG. 9, field oxidation is performed to form device isolation layers 430 and 440 on a surface of the semiconductor substrate 100 exposed by the first hard mask and the second hard mask 331 and 341. The field oxidation may include thermal oxidation. The device isolation layers 430 and 440 are formed as LOCOS device isolation layers, respectively. Since the first hard mask and the second hard mask 331 and 341 formed in the low-voltage device area and a high-voltage device area 101 and 103 have different thicknesses, respectively, the first device isolation layer 430 formed in the low-voltage device area 101 has a first bird's beak 431 smaller than a second bird's beak 441 of the second device isolation layer 440 formed in the high-voltage device area 103.

Fabrication costs may be lowered by reducing the design rule for a logic device. A stable high-voltage device can be fabricated by forming a smooth bird's beak LOCOS layer for the high-voltage device. Thus, the dual bird's beak LOCOS device isolation according to the present invention can be achieved.

Figure 10:
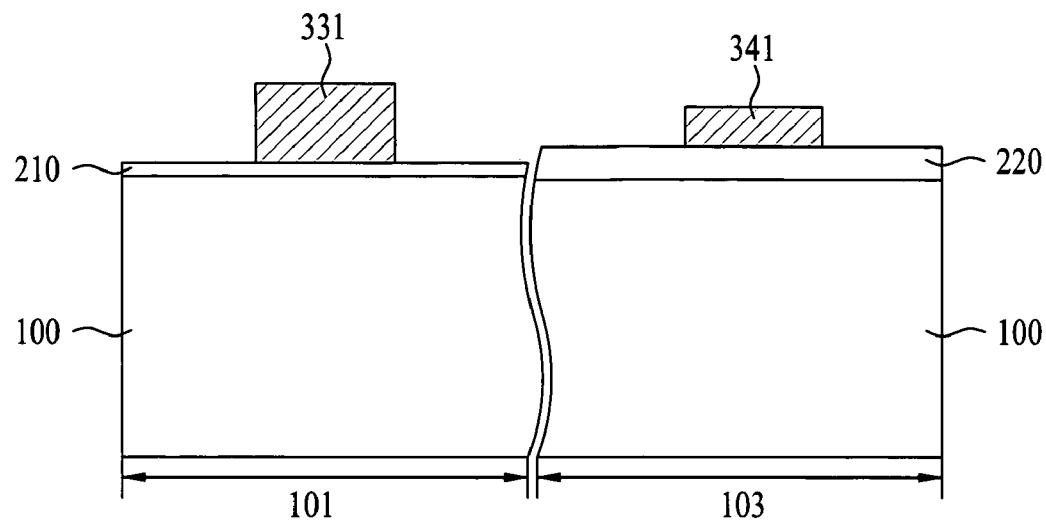
FIGS. 10 and 11 are schematic cross-sectional diagrams of a device fabricated by using a dual bird's beak LOCOS device isolation method according to another exemplary embodiment of the present invention.
Figure 11:
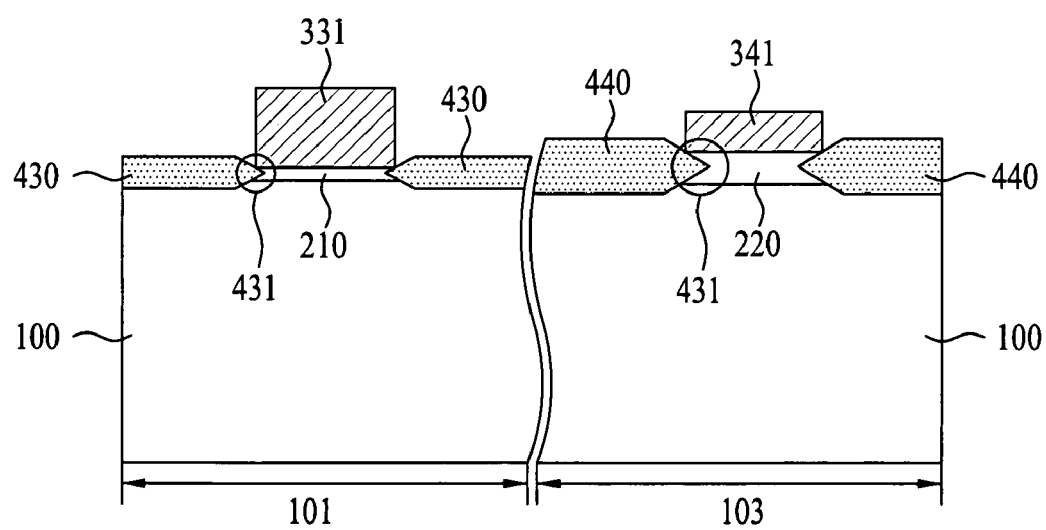

FIGS. 10 and 11 are schematic cross-sectional diagrams of a device fabricated using a dual bird's beak LOCOS device isolation method according to another exemplary embodiment of the present invention.

Referring to FIG. 10, a pad layer 200 for device isolation is formed on a semiconductor substrate 100. The pad layer 200 can include a silicon oxide layer if the semiconductor substrate 100 is a silicon substrate. The semiconductor substrate 100 can be divided into a low-voltage device area 101 for a low-voltage device such as a logic device to be formed thereon and a high-voltage device area 103 for a high-voltage or high-power device to be formed thereon.

Subsequently, the pad layer 200 is selectively etched by photolithography to form a relatively thin first pad layer 210 on the low-voltage device area 101 and a relatively thick second pad layer 220 on the high-voltage device area 103. For example, after a photoresist pattern (not shown) selectively exposing the low-voltage device area 101 has been formed, an exposed portion of the pad layer 200 is selectively etched using the photoresist pattern as an etch mask to reduce its thickness. Hence, the second pad layer 220 substantially maintains its initial thickness of the pad layer 200.

An insulating layer such as silicon nitride for a hard mask is deposited on the first and second pad layers 210 and 220. A hard mask layer, as in the hard mask 301 of FIG. 6, can be called a pad nitride layer.

Subsequently, as explained with reference to FIG. 7, the hard mask layer 301 is selectively etched by photolithography to form a relatively thick first hard mask layer 330 on the low-voltage device area 101 and a relatively thin second hard mask layer 340 on the high-voltage device area 103. For example, after a photoresist pattern (not shown) selectively exposing the high-voltage device area 103 has been formed, an exposed portion of the hard mask layer 301 is selectively etched using the photoresist pattern as an etch mask to reduce its thickness. Hence, the first hard mask layer 311 substantially maintains its initial thickness of the hard mask layer 301.

As explained with reference to FIG. 8, the first hard mask layer and the second hard mask layer 330 and 340 on the first and second pad layers 210 and 220 are patterned to form a first hard mask and a second hard mask 331 and 341 by which active areas having transistor devices formed thereon are covered and by which field areas for device isolation are exposed, respectively.

Referring to FIG. 11, field oxidation is performed to form device isolation layers 430 and 440 on a surface of the semiconductor substrate 100 exposed by the first hard mask and the second hard mask 331 and 341. The field oxidation may include thermal oxidation. The device isolation layers 430 and 440 are formed as LOCOS device isolation layers, respectively. Since the first hard mask and the second hard mask 331 and 341 formed in the low-voltage device area and a high-voltage device area 101 and 103 have different thicknesses, respectively, the first device isolation layer 430 formed in the low-voltage device area 101 has a first bird's beak 431 smaller than a second bird's beak 441 of the second device isolation layer 440 formed in the high-voltage device area 103.

Fabrication costs can be lowered by reducing the design rule for a logic device. A stable high-voltage device can be fabricated by forming a smooth bird's beak LOCOS layer for the high-voltage device. Thus, the dual bird's beak LOCOS device isolation according to the present invention can be achieved.

Accordingly, the LOCOS process may be performed to form device isolation layers having bird's beaks suitable for the sizes required by the logic and high-voltage processes. The design rule associated with the active area in the logic area can be reduced. The smooth profile in the area associated with the high-voltage device is secured. Hence, a high-voltage or a high-power device that is considerably less affected by an electric field can be implemented the high-voltage device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of dual bird's beak LOCOS isolation, comprising:
    defining in a semiconductor substrate a low-voltage device area for a logic device and a high-voltage device area for a high-voltage device;
    forming a pad layer on the semiconductor substrate;
    selectively etching the pad layer in the low-voltage device area to reduce a thickness of the pad layer to form a first pad layer in the low-voltage device area and a second pad layer in the high-voltage device area, the first pad layer being thinner than the second pad layer;
    forming a hard mask on the first pad layer and the second pad layer; and
    forming at least one LOCOS type device isolation layer having bird's beaks differing in size in each of the low-voltage device area and the high-voltage device area, by oxidizing a portion of the semiconductor substrate exposed by the hard mask.

2. The method of claim 1, wherein forming a hard mask comprises:

depositing a silicon nitride layer on the first pad layer and the second pad layer; and patterning the deposited silicon nitride layer.

3. The method of claim 1, wherein the low-voltage device area includes a first device isolation layer having a first bird's beak, wherein the high-voltage device area includes a second device isolation layer having a second bird's beak, and wherein the first bird's beak is smaller than the second bird's beak by a thickness difference between the first pad layer and the second pad layer.

4. A method of dual bird's beak LOCOS isolation, comprising:

defining in a semiconductor substrate a low-voltage device area for a logic device and a high-voltage device area for a high-voltage device;

forming a pad layer on the semiconductor substrate;

depositing a mask layer on the pad layer;

selectively etching the mask layer in the low-voltage device area to reduce a thickness of the mask layer to form, on the pad layer, a first hard mask layer in the low-voltage device area and a second hard mask layer in the high-voltage device area, the first hard mask layer being thicker than the second hard mask layer;

patterning the first hard mask layer and the second hard mask layer to form a first hard mask and a second hard mask, respectively; and forming at least one LOCOS type device isolation layer having bird's beaks differing in size in each of the low-voltage device area and the high-voltage device area, by respectively oxidizing portions of the semiconductor substrate exposed by the first hard mask and the second hard mask.

5. The method of claim 4, further comprising:

depositing a silicon nitride layer on the pad layer.

6. The method of claim 4, wherein the low-voltage device area includes a first device isolation layer having a first bird's beak, wherein the high-voltage device area includes a second device isolation layer having a second bird's beak, and wherein the first bird's beak is smaller than the second bird's beak by a thickness difference between the first hard mask and the second hard mask.

7. A method of dual bird's beak LOCOS isolation, comprising:

defining in a semiconductor substrate a low-voltage device area for a logic device and a high-voltage device area for a high-voltage device;

forming a pad layer on the semiconductor substrate;

selectively etching the pad layer in the low-voltage device area to reduce a thickness of the pad layer to form a first pad layer in the low-voltage device area and a second pad layer in the high-voltage device area, the first pad layer being thinner than the second pad layer;

forming a first hard mask layer on the first pad layer and a second hard mask layer on the second pad layer, the first hard mask layer being thicker than second hard mask layer;

patterning the first hard mask layer and the second hard mask layer to form a first hard mask and a second hard mask, respectively; and forming at least one LOCOS type device isolation layer having bird's beaks differing in size in each of the low-voltage device area and the high-voltage device area, by respectively oxidizing portions of the semiconductor substrate exposed by the first hard mask and the second hard mask.

8. The method of claim 7, said first and second hard mask forming comprising:

depositing a hard mask layer on the first and second pad layers; and selectively etching the hard mask layer covering the second pad layer to reduce a thickness of the etched hard mask layer.

9. The method of claim 8, further comprising:

depositing a silicon nitride layer on the pad layer.

10. The method of claim 7, wherein the low-voltage device area includes a first device isolation layer having a first bird's beak, wherein the high-voltage device area includes a second device isolation layer having a second bird's beak, and wherein the first bird's beak is smaller than the second bird's beak by a thickness difference between the first pad layer and the second pad layer and a thickness difference between the first hard mask and the second hard mask.

* * * * *